(12) United States Patent
Jeong (10) Patent No.: US 10,783,935 B2
(45) Date of Patent: Sep. 22, 2020

(54) SENSE AMPLIFIER DRIVING DEVICE (71) Applicant: MagnaChip Semiconductor, Ltd., Cheongju-si (KR)

(72) Inventor: Duk Ju Jeong, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/794,803

(22) Filed: Oct. 26, 2017

(65) Prior Publication Data
US 2018/0144778 A1 May 24, 2018

(30) Foreign Application Priority Data
Nov. 22, 2016 (KR) .......................... 10-2016-0155933

(51) Int. Cl.
*G11C 7/04* (2006.01)
*G11C 7/06* (2006.01)
*G11C 7/08* (2006.01)
*G11C 7/12* (2006.01)
*G11C 7/10* (2006.01)

(52) U.S. Cl.
CPC ................ *G11C 7/065* (2013.01); *G11C 7/04* (2013.01); *G11C 7/062* (2013.01); *G11C 7/067* (2013.01); *G11C 7/08* (2013.01); *G11C 7/106* (2013.01); *G11C 7/12* (2013.01)

(58) Field of Classification Search
CPC ........................................................ G11C 7/04
See application file for complete search history.

(56) References Cited

U.S. PATENT DOCUMENTS

| | | | | |
|---|---|---|---|---|
| 9,928,917 | B2* | 3/2018 | Shin | G11C 16/24 |
| 2002/0097609 | A1* | 7/2002 | Shiga | G11C 7/1021 |
| | | | | 365/189.02 |
| 2003/0123284 | A1* | 7/2003 | Lowrey | G11C 13/0004 |
| | | | | 365/175 |
| 2007/0104002 | A1* | 5/2007 | Edahiro | G11C 7/06 |
| | | | | 365/203 |
| 2007/0200600 | A1* | 8/2007 | Kang | G11C 5/143 |
| | | | | 327/77 |
| 2008/0198677 | A1* | 8/2008 | Son | G11C 5/143 |
| | | | | 365/226 |
| 2009/0303785 | A1* | 12/2009 | Hwang | G11C 5/147 |
| | | | | 365/163 |
| 2010/0046291 | A1* | 2/2010 | Dudeck | G11C 7/02 |
| | | | | 365/185.05 |

FOREIGN PATENT DOCUMENTS

KR 20120131470 A 12/2012

* cited by examiner

*Primary Examiner* — Douglas King
(74) *Attorney, Agent, or Firm* — Adam P. Daniels, Esq.; Polsinelli PC (57) ABSTRACT

A sense amplifier driving device is disclosed. The device includes a cell array, a bias current generation unit connected to the cell array via a bit line, a sense amplifier connected to the cell array via the bit line to detect and amplify a bit line voltage of the bit line, and a latch unit that outputs the detected bit line voltage as an output signal in a read operation of the cell array. The sense amplifier includes a precharge transistor that precharges the bit line based on a first voltage during a programming operation of the cell array, a read voltage convey unit connected to the bit line and operates during a read operation of the cell array, and a sensing unit that outputs an output voltage based on the bit line voltage.

19 Claims, 5 Drawing Sheets

SENSE AMPLIFIER DRIVING DEVICE

CROSS REFERENCE TO PRIOR APPLICATIONS

This application claims the benefit under 35 U.S.C. § 119(a) to Korean Patent Application No. 10-2016-0155933, filed on Nov. 22, 2016 in the Korean Intellectual Property Office, the entirety of which is hereby incorporated herein by reference.

BACKGROUND OF THE DISCLOSURE

1. Field

The present disclosure relates generally to a semiconductor device, and more specifically it relates to a sense amplifier driving device exhibiting an improved sensing margin.

2. Description of Related Art

Semiconductor devices, in particular, memory devices, include a plurality of memory cells and data input/output lines. The data input/output lines include bit lines, local input/output lines, global input/output lines, etc. Since the data input/output lines are considerably long and the loads between the electronically connected data input/output lines may be different amongst each other, a sense amplifier can be used for signal amplification and smooth data transmission.

In a semiconductor memory device, a read operation can be performed using an inverter that includes an NMOS transistor and a PMOS transistor connected to a bit line. A logic threshold voltage (i.e., logic Vth) of the transistors can change depending on temperature. Due to this transistor threshold voltage fluctuation, the inverter may operate differently when operating at a low temperature (e.g., below 0° C.) and when operating at a room temperature (e.g., 25° C.). In particular, when a bit line voltage is close to the logic threshold voltage of the transistors, the inverter may carry out a read operation at room temperature, but may fail to carry out a read operation at a low temperature.

Accordingly, there is a need for a semiconductor device that can reliably carry out a read operation at low temperatures, as well as room temperature (or higher).

SUMMARY OF THE DISCLOSURE

According to one aspect of the present disclosure, a sense amplifier driving device includes a cell array, a bias current generation unit that is connected to the cell array via a bit line, a sense amplifier that is connected to the cell array via the bit line and detects and amplifies a bit line voltage of the bit line, and a latch unit that outputs the detected bit line voltage as an output signal in a read operation of the cell array. The sense amplifier includes a precharge transistor that precharges the bit line based on a first voltage during a programming operation of the cell array, a read voltage convey unit that is connected to the bit line and operates during a read operation of the cell array, and a sensing unit that outputs an output voltage based on the bit line voltage.

The precharge transistor may be turned on or off based on a precharge signal, and the precharge transistor may be turned on during a programming operation, and may precharge the bit line based on the first voltage.

The sensing unit may include an inverter that receives the bit line voltage. The inverter may include a first transistor of a first conductivity type that receives the first voltage, and a second transistor of a second conductivity type. The first and second transistors may be connected in series. The sensing unit may further include a third transistor connected to the second transistor.

The third transistor may include a drain terminal and a gate terminal that are connected to each other.

The second transistor may include a source terminal connected to a drain terminal of the third transistor.

The read voltage convey unit may include a fourth transistor of the first conductivity type that is connected to the bit line, a fifth transistor of the first conductivity type, and a mode selection unit that generates a read control signal during a read operation.

The fifth transistor may be controlled by the read control signal from the mode selection unit.

The fourth transistor may have a threshold voltage that is lower than a threshold voltage of the first transistor.

The read voltage convey unit may further include a fifth transistor of the first conductivity type. The fifth transistor may include a source terminal connected to the first voltage, a drain terminal connected to the fourth transistor, and a gate terminal connected to the mode selection unit.

The fourth transistor may include a gate terminal connected to the bit line and a drain terminal connected to an output of the sensing unit.

The bias current generation unit may convey a bias current to the bit line during the read operation.

The bit line may be connected to a programmed or unprogrammed cell. The bit line may be discharged through the programmed cell during the read operation, and the bit line may be precharged to the first voltage during the read operation.

The latch unit may include a transmission gate that latches the detected bit line voltage from the sense amplifier based on an enable signal during the read operation.

According to another aspect of the disclosure, a semiconductor device includes a cell connected to a bit line and a sense amplifier that is connected to the cell via the bit line and detects and amplifies a bit line voltage of the bit line. The sense amplifier includes a sensing unit that amplifies the bit line voltage during a read operation of the cell, the sensing unit operating at a first threshold voltage. The sense amplifier may include a read voltage convey unit that generates a read voltage based on the bit line voltage during the read operation of the cell. The read voltage convey unit comprises a switching device that operates at a second threshold voltage that is lower than the first threshold voltage.

The sensing unit may include an inverter that includes first and second transistors connected in series and receiving the bit line voltage, the first transistor having the first threshold voltage.

The switching device may include a fourth transistor that outputs a read voltage based on the bit line voltage, the fourth transistor having the second threshold voltage that is lower than the first threshold voltage.

The read voltage convey unit may include a fifth transistor that receives a first voltage and is selectively turned on based on a mode selection signal applied thereto, wherein the fifth transistor is connected to the fourth transistor in series.

The sensing unit may include a third transistor connected to the second transistor in series, including gate and drain terminals connected to each other.

According to yet another aspect of the disclosure, a sensing device includes a sensing unit that detects a bit line voltage of a bit line connected to a cell during a read operation of the cell. The sensing unit operates at a first threshold voltage. The sensing device may include a read voltage convey unit that generates a read voltage based on the bit line voltage during the read operation of the cell. The read voltage convey unit includes a fifth transistor that has the first threshold voltage, and a fourth transistor that is connected to the first transistor in series and has at a second threshold voltage that is lower than the first threshold voltage.

The sensing unit may include an inverter that includes first and second transistors connected in series and receiving the bit line voltage.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION OF THE DISCLOSURE

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Figure 1:
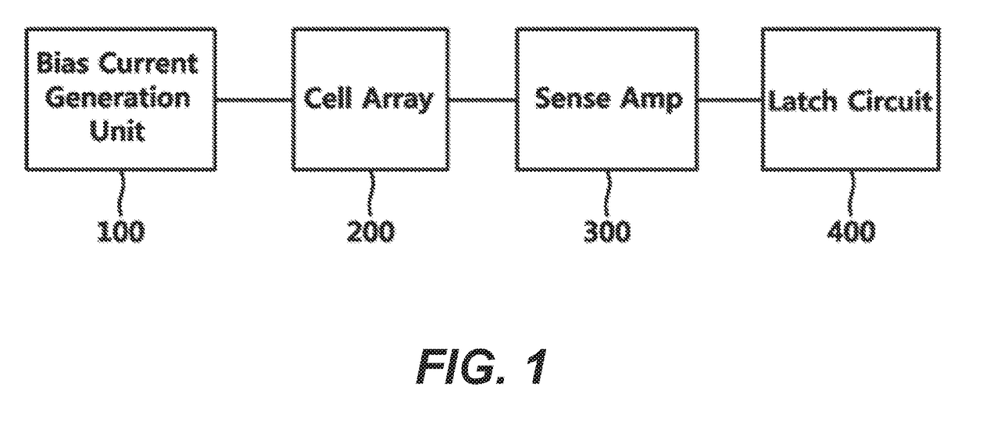
FIG. 1 schematically illustrates an example of a sense amplifier driving device, constructed according to the principles of the disclosure.

FIG. 1 illustrates an example of a sense amplifier driving device, constructed according to the principles of the disclosure. The sense amplifier driving device may include, for example, a bias current generation unit 100, a cell array 200, a sense amplifier 300, and a latch unit 400.

The bias current generation unit 100 may be connected to the cell array 200 via a bit line. The sense amplifier 300 may be connected to the cell array 200 via the bit line and may detect and amplify a voltage of the bit line. The bias current generation unit 100 may generate and supply a bias current (e.g., tens of nanoamperes) to the cell array 200. For example, the bias current generation unit 100 may generate and convey a bias current to the bit line during a read operation of the cell array 200.

The cell array 200 may include, for example, a plurality of memory cells (shown in FIG. 2) arranged in a matrix, a plurality of bit lines (only one shown in FIGS. 2 and 3), a plurality of word lines (not shown), circuits for selectively activating the bit lines and word lines (not shown). Each cell may include a switching device (not shown) and a capacitor (not shown), and may be connected to the corresponding word line and bit line. The switching device may be connected between the bit line and the capacitor, and may selectively perform a switching operation based on a signal provided thereto via the corresponding word line. The cell array 200 may be, for example, a one-time programmable (OTP) memory cell array, which may include a plurality of programmed and unprogrammed OTP cells.

The sense amplifier 300 may be connected to a bit line and configured to perform a read operation of the cell connected to the same bit line. The sense amplifier 300 may determine whether a cell is a programmed cell or an unprogrammed cell when carrying out a read operation.

The latch unit 400 may be configured to maintain data output from the sense amplifier 300 for a certain period. For example, when a low level signal is received from the sense amplifier 300, the latch unit 400 may maintain and output a low level signal until new data is received. When a high level signal is received, the latch unit 400 may maintain and output a high level signal until new data is received. The latch unit 400 may output a voltage detected by the sense amplifier 300 during a read operation as an output voltage.

Figure 2:
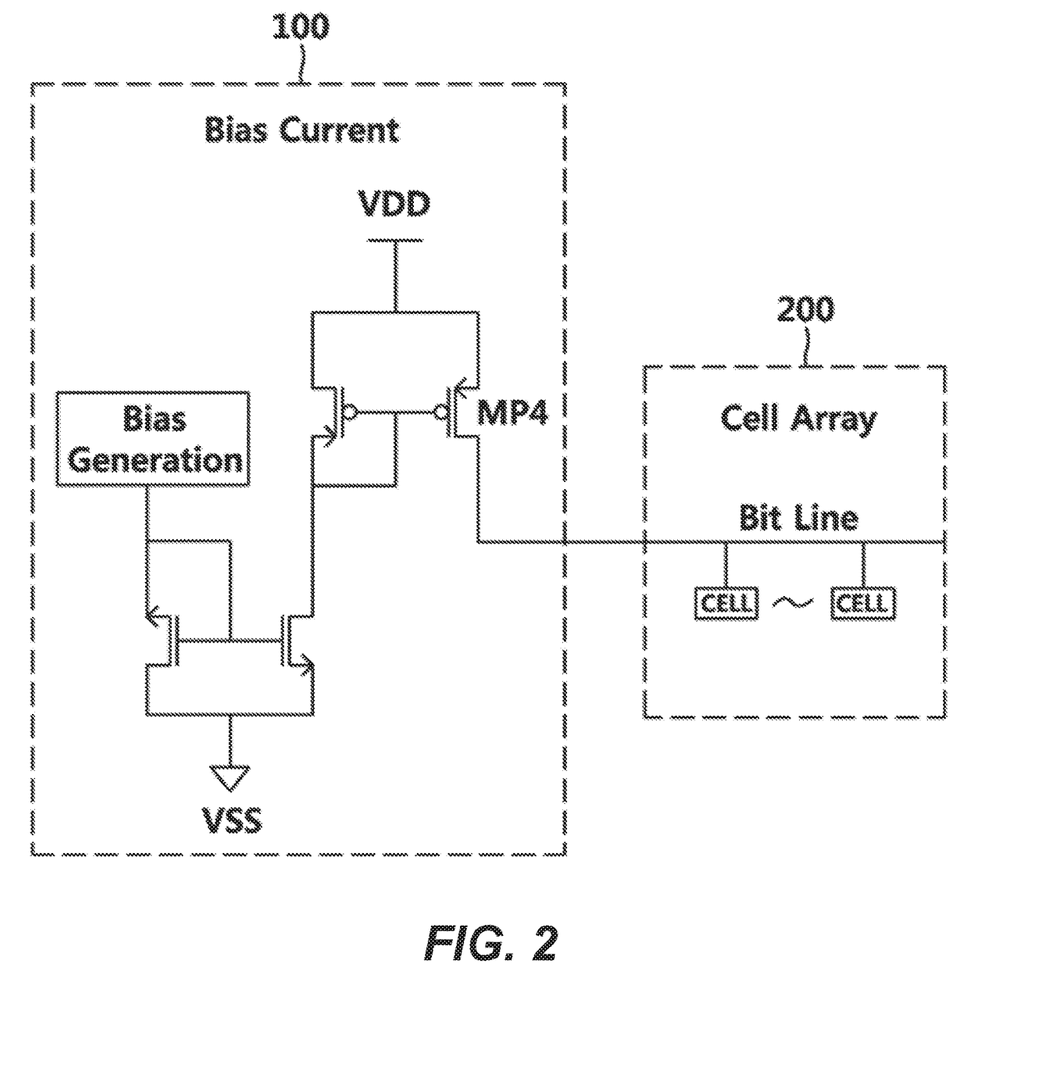
FIG. 2 schematically illustrates an example of a bias current generation unit and a cell array, constructed according to the principles of the disclosure.

FIG. 2 illustrates an example of the bias current generation unit 100 and a cell array 200, constructed according to the principles of the disclosure. The bias current generation unit 100 may include, for example, a bias generation circuit and a plurality of transistors (e.g., NMOS and PMOS transistors) coupled between a first voltage VDD (e.g., positive voltage) and a second voltage VSS (e.g., ground voltage). The plurality of transistors may include, for example, a transistor (e.g., PMOS transistor) MP4 connected to the bit line.

The bias current generation unit 100 may supply a bias current, which may be used to carry out a read operation on the OTP cells, in the cell array 200. When the bias current generation circuit generates and supplies the bias current to an NMOS transistor, the same current may be supplied to the bit line of the cell array 200 through a pair of NMOS transistors and a pair of PMOS transistors arranged and connected to form a current mirror, as seen in FIG. 2.

The cell array 200, connected to the bit line, may receive signals required for read and write operations. A density of the cell array 200 may be determined by a number of cells arrayed to a bit line. For example, a cell array having eight (8) cells arrayed to a bit line has an eight (8) bit cell array density. In another example, an OTP cell may be formed to have a sixty four (64) bit density by arraying eight (8) cells are to each of eight (8) bit lines. A cell array may be formed to have a desired cell array density by arraying a desired number of cells to one or more bit lines. In a programmed cell, a current path is formed therein and the voltage of the bit line may be discharged to a ground. An unprogrammed cell may not have a current path to the ground, and the bit line connected to an unprogrammed cell may maintain the first voltage VDD.

Figure 3:
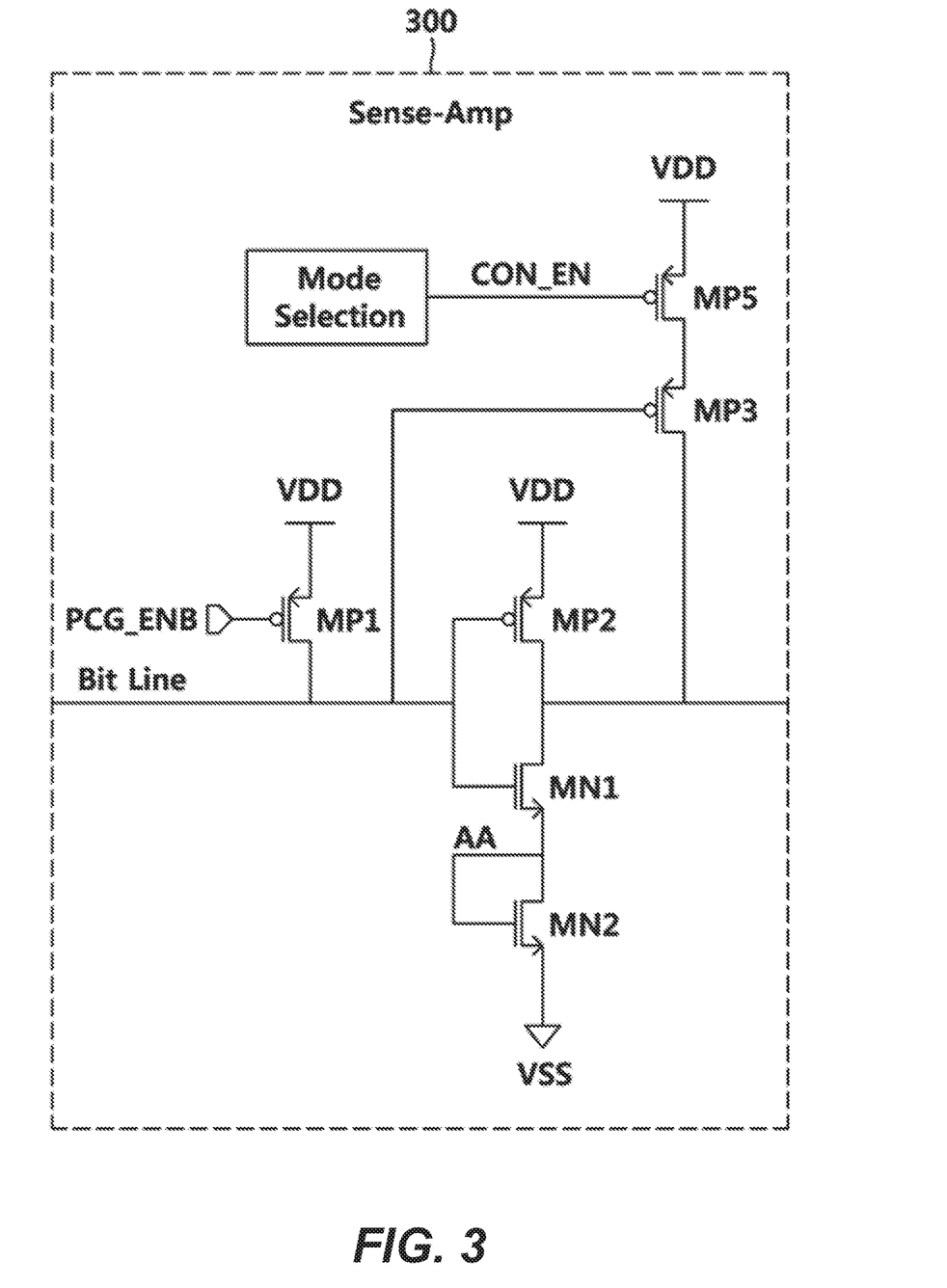
FIG. 3 schematically illustrates an example of a sense amplifier, constructed according to the principles of the disclosure.

FIG. 3 illustrates an example of the sense amplifier 300, constructed according to the principles of the disclosure. The sense amplifier 300 may include, for example, a precharge transistor MP1, a sensing unit, and a read voltage convey unit. The precharge transistor MP1 may be, for example, a PMOS transistor, and may operate during a program operation of the cell array 200 to precharge the bit line to the first voltage VDD. The sensing unit may generate and output an output voltage based on the bit line voltage. The read voltage convey unit may be connected to the bit line and may operate during a read operation of the cell array 200.

In FIG. 3, the precharge transistor MP1 may maintain the bit line at the first voltage VDD during a programming operation. A source terminal of the precharge transistor MP1 may be connected to the first voltage VDD. A precharge signal PCG_ENB may be supplied to a gate terminal of the precharge transistor MP1. A drain of the precharge transistor MP1 may be connected to the bit line. The precharge transistor MP1 may be turned on or off based on the precharge signal PCG_ENB, and may precharge the bit line at the operation voltage VDD when turned on during a programming operation.

The sensing unit may output an output voltage based on a voltage at the bit line. The sensing unit may include, for example, an inverter connected to the bit line. The inverter may include, for example, first and second transistors MP2, MN1 connected in series, which may be, for example, PMOS and NMOS transistors, respectively. The sensing unit may further include a third transistor MN2 connected to the inverter. The third transistor MN2 may be connected to the second MN1 transistor of the inverter.

The bit line may be connected to gate terminals of the first and second transistors MP2, MN1. A source terminal of the first transistor MP2 may be connected to the first voltage VDD, and a drain terminal of the first transistor MP2 may be connected to a drain terminal of the second transistor MN1. A source terminal of the second transistor MN1 may be connected to a drain terminal of the third transistor MN2, and drain and gate terminals of the third transistor MN2 may be connected to each other. A source terminal of the third transistor MN2 may be connected to the second voltage VSS. The third transistor MN2 may function as a diode as the drain and gate terminals are connected to each other, and may increase a logic threshold voltage of the sensing unit.

The read voltage convey unit may include, for example, a fourth transistor MP3, a fifth transistor MP5, and a mode selection unit. The fourth and fifth transistors MP3, MP5 may be a PMOS transistor. As seen in FIG. 3, a source terminal of the fourth transistor MP3 may be connected to a drain terminal of the fifth transistor MP5. A drain terminal of the fourth transistor MP3 may be connected to the drain terminals of the first and second transistors MP2, MN1, and a gate terminal of the fourth transistor MP3 may be connected to the bit line. A source terminal of the fifth transistor MP5 may be connected to the first voltage VDD, and a gate terminal of the MP5 transistor may be connected to the mode selection unit, which may generate and output a read control signal CON_EN to control the fifth transistor MP5.

When the precharge signal PCG_ENB is low (or zero (0)), the precharge transistor MP1 may be turned on to connect the bit line to the first voltage VDD, which may precharge the bit line to the first voltage VDD level. The precharge signal PCG_ENB may become high (or one (1)) when a read operation starts, and the precharge transistor MP1 may be turned off to stop precharging the bit line.

In the case of an unprogrammed cell, the bit line may maintain the first voltage VDD by the precharge signal PCG_ENB. When the read operation starts, the precharge signal PCG_ENB may become high and the bit line may maintain the VDD level as a current is continuously supplied by the transistor MP4 (shown in FIG. 2) of the bias current generation unit 100.

In the case of a programmed cell, when the read operation starts, a current may be supplied by the transistor MP4 but discharged by the current path in the programmed cell, and the voltage of the bit line may be gradually lowered to the second voltage VSS.

At this moment, since the gate and drain terminals of the third transistor MN2 are connected to each other at a node AA, a voltage at the node AA may be kept at, for example, about 0.3 V, and a logic threshold voltage Vth of the inverter, including the first and second transistors MP2, MN1, may be increased. As the voltage at the AA node increases to, for example, about 0.3V, a gate-source voltage Vgs at the second transistor MN1 may be lowered. As the gate-source voltage Vgs at the first transistor MP2 is relatively increased, the logic threshold voltage Vth of the inverter functioning as a sense amplifier may be increased and may secure a sensing margin.

While other transistors are configured to operate at a normal threshold voltage Vth, the fourth transistor MP3 may be configured to operate at a threshold voltage that is lower than the normal threshold voltage Vth. When sensing is performed by using the first (PMOS) transistor and the second (NMOS) transistor having a normal threshold voltage, the sensing characteristic may deteriorate since the threshold voltage Vth may increase at a low temperature (such as, for example, 0° C.) when compared to a room temperature (such as, for example, 25° C.). To compensate for the varying performance based on ambient temperature, the fourth transistor MP3 may be connected to the bit line.

The fourth transistor MP3 may have a threshold voltage (Vth) of, for example, about 0.1 V lower than a normal threshold voltage Vth of other transistors, for example, first transistor MP2. Namely, to compensate for the deteriorated characteristics of the sensing margin at low temperatures according to the increase in Vth, the fourth transistor MP3 may have a lower threshold voltage than the normal threshold voltage. Namely, since the fourth transistor MP3 has a threshold voltage Vth lower than the normal threshold voltage of, for example, the first transistor MP2, the fourth transistor may be turned on quicker than the MP2 transistor at lower temperatures during a read operation.

As seen in FIG. 3, a read control signal CON_EN may be generated by a mode selection unit when a programming or read operation is performed in the OTP cell. During a programming operation, the read control signal CON_EN may become high (or one), which may turn off the fifth transistor MP5. When a read operation is performed after the completion of the programming operation, the read control signal CON_EN may become low (or zero), which may turn on the fifth transistor MP5. The fourth transistor MP3 may be controlled by the read control signal CON_EN.

When a programming operation is operated at a room temperature, the read control signal CON_EN may become high and the fourth transistor MP3 may be turned off, and the sensing operation may be performed by the first, second and third transistors MP2, MN1, MN2. When a read operation is performed, the first, second, third and fourth transistors MP2, MN1, MN2, MP3 may be simultaneously turned on, which may secure the sensing margin of the logic inverter, and hence improve a sensing margin of the inverter.

While a programming operation may need to be performed in a room temperature, a read operation may be performed in any temperatures, e.g., a room temperature, a low temperature, and a high temperature. When a read operation is performed after completion of a programming operation, the increased logic threshold voltage Vth of the inverter may be compensated at low temperatures by the addition of the fourth transistor MP3, and the sensing margin may be secured.

Figure 4:
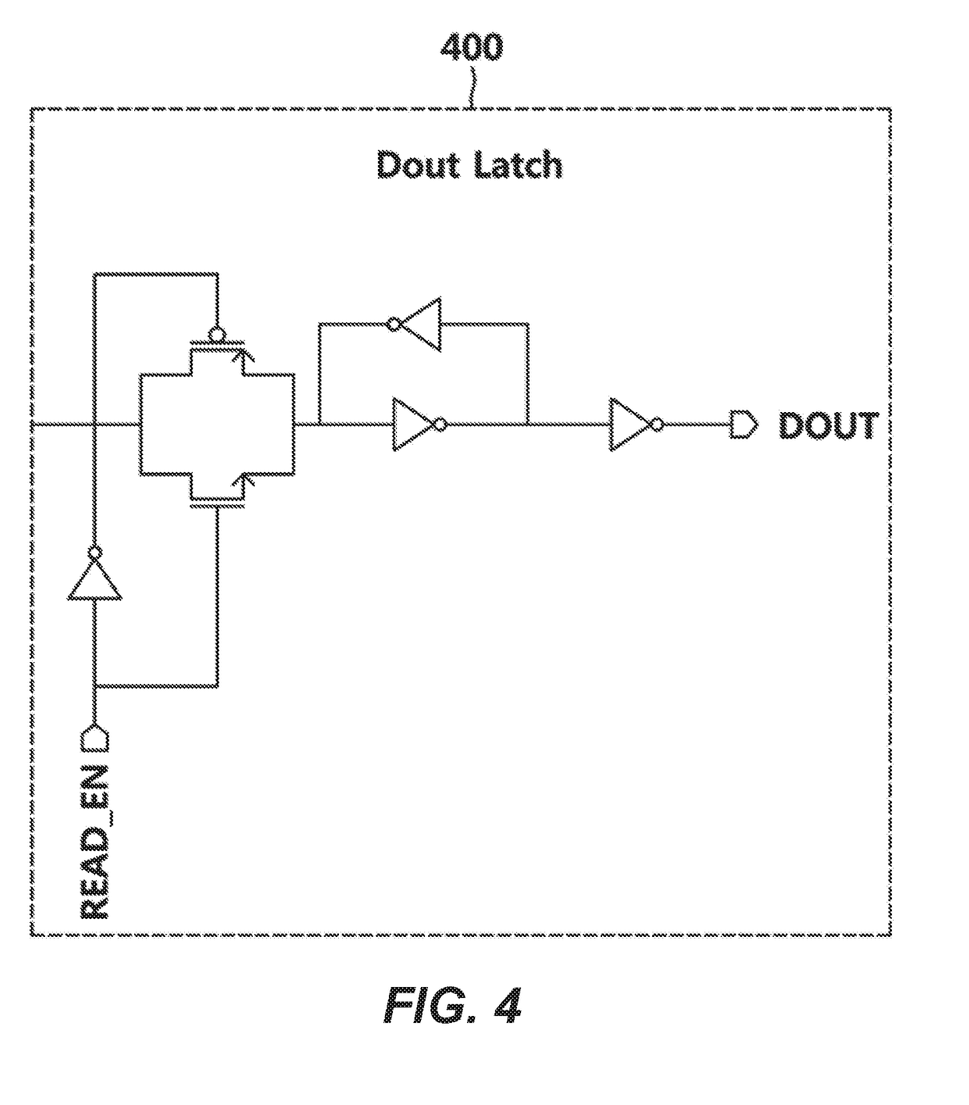
FIG. 4 schematically illustrates an example of a latch unit, constructed according to the principles of the disclosure.

FIG. 4 illustrates an example of the latch unit 400, constructed according to the principles of the disclosure. The latch unit 400 may latch a sensed read signal through a transmission gate based on a read enable signal READ_EN signal during a read operation, and may output the latched signal as an output signal DOUT. The transmission gate may include, for example, an NMOS transistor and a PMOS transistor connected in parallel, and may transmit the output signal from the sense amplifier 300 to the latch through the sensing amplifier.

Namely, when a programmed cell is sensed, a current is drained through the cell, the voltage of the bit line becomes low, and the sensing result is latched as being high (or one) and the output signal DOUT also becomes high. When an unprogrammed cell is sensed, the bit line is precharged to the first voltage VDD, the sensing result becomes low and latched as being low level, and the output DOUT also becomes low.

Figure 5:
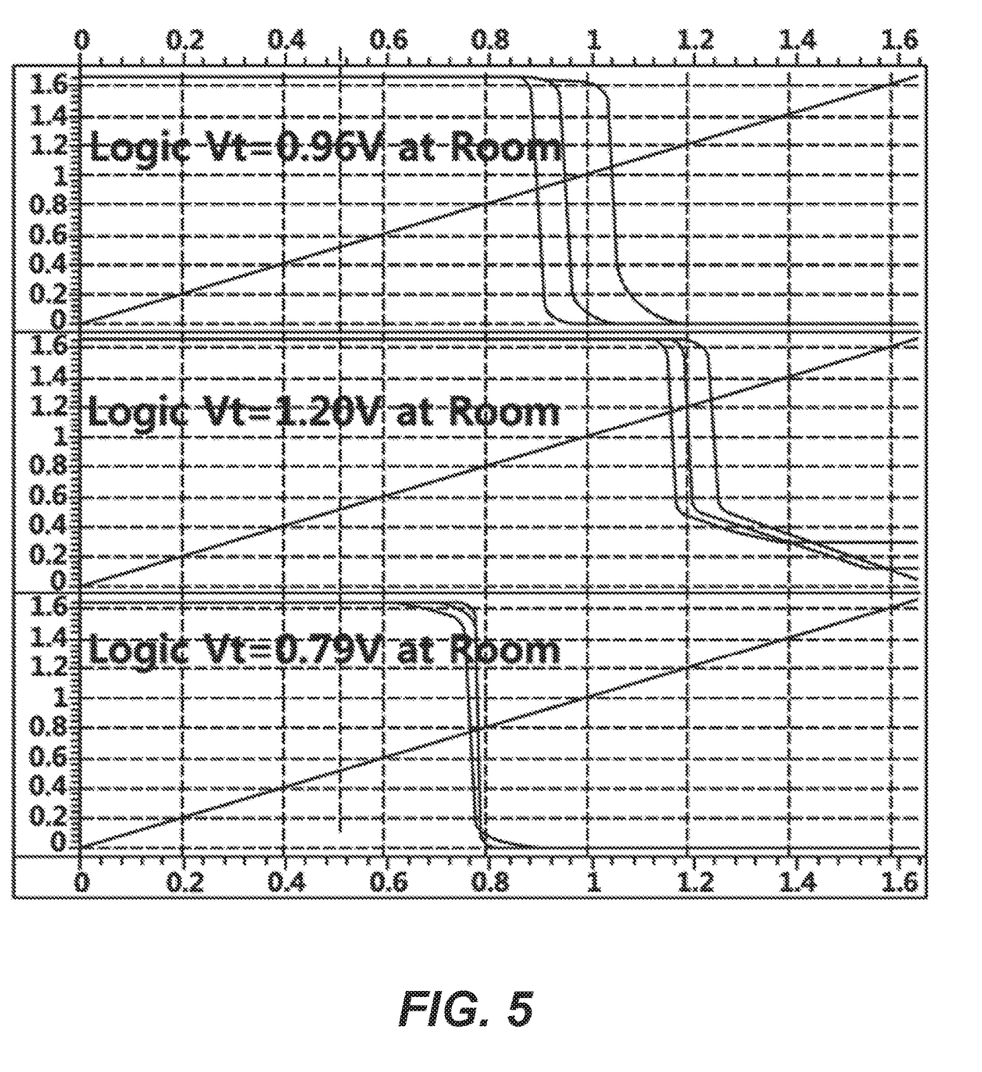
FIG. 5 is a drawing illustrating an example of simulation results according to the principles of the disclosure.

FIG. 5 shows graphs showing simulation results according to the principles of the disclosure. In the graphs, the horizontal axis represents the logic threshold voltages, and the vertical axis represents the output voltages of the sense amplifier 300. And each graphs shows at low, room and high temperatures respectively from left side.

The lower graph shows that the logic threshold voltage is 0.79 V when a magnitude ratio of a PMOS transistor to an NMOS transistor is 2:1. The top graph shows that a sensing gain is improved by the logic threshold voltage of 0.96 V when the PMOS to NMOS magnitude ratio is 40:1 or higher. The middle graph shows that, when the third transistor MN2 operating as an NMOS diode is connected to the second transistor MN1 in series according to the examples of the present disclosure while maintaining the PMOS to NMOS magnitude ratio at 40:1 or higher, the logic threshold voltage Vth increases to 1.20 V and the sensing gain may be greatly improved.

In conclusion, by connecting the third transistor MN2 operating as an NMOS diode to the second transistor MN1 while maintaining the PMOS to NMOS magnitude ratio at 40:1 or higher, the logic threshold voltage Vth may increase to 1.20 V and the sensing gain may be greatly improved.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A sense amplifier driving device, comprising:
   a cell array;
   a bias current generation unit connected to the cell array via a bit line;
   a sense amplifier that is connected to the cell array via the bit line, the sense amplifier is configured to detect and amplify a bit line voltage of the bit line; and
   a latch unit configured to output the detected bit line voltage as an output signal during a read operation of the cell array,
   wherein the sense amplifier comprises:
      a controller coupled to a precharge control line;
      a precharge transistor coupled to the precharge control line and a precharge voltage supply line having a first voltage, wherein the controller is configured to turn the precharge transistor on to precharge the bit line based on the first voltage during a programming operation of the cell array, and turn the precharge transistor off to stop precharging the bit line prior to the read operation;
      a read voltage convey unit connected to the bit line, the read voltage convey unit is configured to operate during the read operation of the cell array; and
      a sensing unit connected to the bit line and configured to output an output voltage based on the bit line voltage, wherein the sensing unit is configured to operate at a first threshold voltage and the read voltage convey unit is configured to operate at a second threshold voltage that is lower than the first threshold voltage.

2. The sense amplifier driving device of claim 1, wherein the sensing unit comprises an inverter configured to receive the bit line voltage, wherein the inverter comprises:
   a first transistor of a first conductivity type that receives the first voltage; and
   a second transistor of a second conductivity type,
   wherein the first and second transistors are connected in series, and wherein the sensing unit further comprises a third transistor connected to the second transistor.

3. The sense amplifier driving device of claim 2, wherein the third transistor comprises a drain terminal and a gate terminal that are connected to each other.

4. The sense amplifier driving device of claim 2, wherein the third transistor comprises a drain terminal connected to a source terminal of the second transistor, and a source terminal connected to a ground voltage.

5. The sense amplifier driving device of claim 2, wherein the read voltage convey unit comprises a fourth transistor of a first conductivity that is connected to the bit line, and wherein the fourth transistor has a threshold voltage that is lower than a threshold voltage of the first transistor.

6. The sense amplifier driving device of claim 1, wherein the read voltage convey unit comprises:
a fourth transistor of a first conductivity that is connected to the bit line; and
a mode selection unit configured to generate a read control signal during the read operation.

7. The sense amplifier driving device of claim 6, wherein the read voltage convey unit further comprises a fifth transistor of the first conductivity, the fifth transistor comprising:
a source terminal connected to the first voltage,
a drain terminal connected to the fourth transistor, and
a gate terminal connected to the mode selection unit.

8. The sense amplifier driving device of claim 6, wherein the fourth transistor comprises:
a gate terminal connected to the bit line, and
a drain terminal connected to an output of the sensing unit.

9. The sense amplifier driving device of claim 1, wherein the bias current generation unit is configured to convey a bias current to the bit line during the read operation.

10. The sense amplifier driving device of claim 1, wherein the bit line is connected to a programmed or unprogrammed cell, wherein the bit line is configured to discharge through the programmed cell during the read operation.

11. The sense amplifier driving device of claim 1, wherein the latch unit comprises a transmission gate configured to latch the detected bit line voltage from the sense amplifier based on an enable signal during the read operation.

12. A semiconductor device, comprising:
a cell connected to a bit line;
a controller coupled to a precharge control line; and
a sense amplifier that is connected to the cell via the bit line, the sense amplifier is configured to detect and amplify a bit line voltage of the bit line, wherein the sense amplifier comprises:
a precharge unit having a precharge transistor coupled to the precharge control line, a precharge voltage supply line, and the bit line, wherein the controller turns the precharge transistor off to stop precharging the bit line prior to a read operation;
a sensing unit configured to amplify the bit line voltage during the read operation of the cell, the sensing unit operating at a first threshold voltage; and
a read voltage convey unit configured to generate a read voltage based on the bit line voltage during the read operation of the cell,
wherein the read voltage convey unit comprises a switching device coupled to the bit line, the switching device is configured to turn on or turn off based on the bit line voltage and operates at a second threshold voltage that is lower than the first threshold voltage.

13. The semiconductor device of claim 12, wherein the sensing unit comprises an inverter that comprises first and second transistors connected in series and receiving the bit line voltage, the first transistor having the first threshold voltage.

14. The semiconductor device of claim 13, wherein the switching device comprises a third transistor that outputs a read voltage based on the bit line voltage, the third transistor having the second threshold voltage that is lower than the first threshold voltage.

15. The semiconductor device of claim 14, wherein the read voltage convey unit further comprises a fourth transistor that receives a first voltage and is selectively turned on based on a mode selection signal applied thereto,
wherein the third transistor is connected to the fourth transistor in series.

16. The semiconductor device of claim 15, wherein the sensing unit further comprises a fifth transistor connected to the second transistor in series and comprising gate and drain terminals connected to each other.

17. A sensing device, comprising:
a controller coupled to a precharge control line;
a sensing unit connected to a bit line and configured to operate at a first threshold voltage and detect a bit line voltage of the bit line connected to a cell during a read operation of the cell;
a precharge unit having a precharge transistor coupled to the precharge control line and a precharge voltage supply line, wherein the controller is configured to turn the precharge transistor on to electrically couple the bit line to the precharge voltage supply line during a programming operation of the cell, and turn the precharge transistor off to electrically decouple the bit line from the precharge voltage supply line to stop precharging the bit line prior to the read operation; and
a read voltage convey unit configured to generate a read voltage based on the bit line voltage during the read operation of the cell, wherein the read voltage convey unit comprises:
a first transistor; and
a second transistor connected to the first transistor in series, the second transistor is configured to operate at a second threshold voltage and turn on or turn off based on the bit line voltage.

18. The sensing device of claim 17, wherein the sensing unit comprises an inverter that comprises third and fourth transistors connected in series and receiving the bit line voltage.

19. A sense amplifier driving device, comprising:
a cell array;
a bias current generation unit connected to the cell array via a bit line;
a sense amplifier connected to the cell array via the bit line, the sense amplifier is configured to detect and amplify a bit line voltage of the bit line and output an output voltage based on the bit line voltage; and
a latch unit configured to output the detected bit line voltage as an output signal during a read operation of the cell array,
wherein the sense amplifier includes:
a read voltage convey unit that is connected to the bit line, the read voltage convey unit is configured to operate during the read operation of the cell array; and
a sensing unit connected to the bit line and configured to operate at a first threshold voltage and the read voltage convey unit is configured to operate at a second threshold voltage that is lower than the first threshold voltage, wherein the sensing unit comprises:
an inverter having a first transistor of a first conductivity type that receives a first voltage;
a second transistor of a second conductivity type coupled to the first transistor in series; and
a diode coupled to the second transistor in series.

* * * * *